United States Patent
Vemula et al.

(10) Patent No.: US 9,025,288 B2
(45) Date of Patent: May 5, 2015

(54) CROSS TALK MITIGATION

(71) Applicant: NXP B.V., Eindhoven (NL)

(72) Inventors: Madan Vemula, Tempe, AZ (US);
James Caravella, Chandler, AZ (US);
James Spehar, Chandler, AZ (US);
Gerrit Willem den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 13/835,554

(22) Filed: Mar. 15, 2013

(65) Prior Publication Data

US 2014/0268445 A1 Sep. 18, 2014

(51) Int. Cl.
*H02H 9/00* (2006.01)
*H02H 9/04* (2006.01)

(52) U.S. Cl.
CPC ............ *H02H 9/041* (2013.01); *H02H 9/046* (2013.01)

(58) Field of Classification Search
USPC ......................................................... 361/56
See application file for complete search history.

(56) References Cited

U.S. PATENT DOCUMENTS 7,253,980 B1 * 8/2007 Pham et al. ............... 360/46
8,093,677 B2 * 1/2012 Stecher et al. ............ 257/508
2012/0025927 A1   2/2012 Yan et al.
2012/0119794 A1   5/2012 Den Besten
2012/0146705 A1   6/2012 Den Besten
2012/0243712 A1   9/2012 Yamada
2012/0286588 A1  11/2012 Steeneken et al.

OTHER PUBLICATIONS

Extended European Search Report for EP Patent Appln. No. 14157895.5 (Mar. 4, 2015).

\* cited by examiner

*Primary Examiner* — Stephen W Jackson (57) ABSTRACT

Cross-talk is mitigated in a switching circuit. In accordance with one or more embodiments, an apparatus includes a multi-pin connector having signal-carrying electrodes that communicate with a device external to the apparatus, and respective field-effect switches that couple the signal-carrying electrodes to respective communication channels in the apparatus. The switches include a first field-effect semiconductor switch having a gate electrode adjacent a channel region that connects electrodes (e.g., source and drain regions) when a threshold switching voltage is applied to the gate, in which the electrodes are connected between one of the signal-carrying electrodes and a first channel coupled to an electrostatic discharge (ESD) circuit. A bias circuit mitigates cross-talk between the communication channels by biasing the channel region of the first field-effect semiconductor switch (in an off state) to boost the threshold switching voltage over a threshold discharge voltage of the ESD circuit.

20 Claims, 6 Drawing Sheets

CROSS TALK MITIGATION

Aspects of various embodiments are directed to switching circuits, and to mitigating cross talk between channels connected by respective switches.

Many switching applications such as those involving multiplexers are used to switch a variety of different types of signals. In various applications, such switches/multiplexers are used to connect multi-pin communication links between devices, such as between a portable type device that communicates data such as universal serial bus (USB) data as well as media data such as audio and video. For example, many portable devices connect via multi-pin (and other similar) connectors to pass power for charging the portable device, data for communicating with a variety of aspects of the device, and media content such as audio and/or video. Data may, for example, be communicated/transmitted via a communication cable or docking station between a host (e.g., PC, tablet) and a device (e.g., tablet, external hard drive).

While such switching and connectivity has been useful, issues can arise when switching certain types of signals. For example, in high speed multiplexer or other passive switch applications, signals on certain channels can adversely affect switching connectivity and initiate cross-talk between channels. Using a switching example in a multiplexer involving 5V tolerant floating gate NMOS switches or charge pump-based NMOS switches, if an active channel carries a signal having a negative voltage, disabled paths can be undesirably enabled as the signal goes negative relative to the gate and switches in an "OFF" state begin to conduct. In another switching example involving 5V tolerant PMOS switches or transmission gate switches, if an active channel carries a signal having positive voltage higher than the supply and below the voltage where ESD diode would clamp, the disabled paths can be undesirably enabled. These and other matters have presented challenges to the communication of data such as media data, for a variety of applications.

Various example embodiments are directed to switching circuits involving cross talk mitigation, and their implementation.

According to an example embodiment, an apparatus includes a multi-pin connector including at least first and second signal-carrying electrodes that communicate with a device external to the apparatus, a first switch (e.g., a MOS transistor) having a gate electrode adjacent a channel that connects first and second electrodes in response to a threshold switching voltage applied to the gate electrode, and a second field-effect semiconductor switch connected between the second signal-carrying electrode and the first channel. The first and second electrodes (e.g., source and drain regions) are connected between the first signal-carrying electrode and a first channel, and when the channel is in a conducting state, couple the first channel with the first signal-carrying electrode. An electrostatic discharge (ESD) circuit includes a diode that connects the first channel and a reference voltage, and switches to a conducting state in response to a voltage on the first channel that breaches a threshold discharge voltage (e.g., grows more negative than the threshold in NMOS application). A bias circuit mitigates cross-talk between the first and second channels when the first field-effect semiconductor switch is in an off state by biasing the channel region and boosting the threshold switching voltage to a level that is greater than the ESD threshold discharge or clamp voltage. In this regard, the biasing mitigates passage of signals, from one of the signal-carrying electrodes connected to the first channel via the first field-effect semiconductor switch, to the second channel via the first field-effect semiconductor switch. This mitigation may be effected, for example, when a signal such as a universal serial bus (USB) signal is present on the first channel (e.g., passed via the second switch to the first signal-carrying electrode).

Another example embodiment is directed to an apparatus having a multi-pin connector including at least first and second signal-carrying electrodes that communicate with a device external to the apparatus, first and second switching circuits, an ESD circuit and a well bias circuit. The first switching circuit includes first and second field-effect semiconductor switches that respectively connect the first and second signal-carrying electrodes to a first channel. The first field-effect semiconductor switch has source and drain regions connected by a channel in a well region, and a gate that switches the channel to a conducting state in response to a threshold switching voltage, which is based upon a bias state of the well region. The second switching circuit has with third and fourth field-effect semiconductor switches that respectively connect the first and second signal-carrying electrodes to a second channel. The ESD circuit includes a diode that connects the first channel and a reference voltage, and discharges current by switching to a conducting state in response to a voltage on the first channel below a threshold discharge voltage. The well bias circuit mitigates cross-talk between the channels by biasing the well region and boosting the threshold switching voltage to a high level in response to the first field-effect semiconductor switch being in an off state, the high level being higher than the threshold discharge voltage set by the ESD diode to reference (e.g., ground). This biasing is used to mitigate passage of a signal, from one of the signal-carrying electrodes that is connected to the first channel via the first switching circuit, to the second channel via the first switching circuit (e.g., when the signal on the second channel goes below the reference voltage).

Another example embodiment is directed to a media playback apparatus having a user interface that presents audio to a user, an audio playback circuit module that presents audio signals to the user interface using audio data to the generate audio signals, and a multi-pin connector including at least first and second signal-carrying electrodes that concurrently communicate both the audio data and universal serial bus (USB) signals with a device external to the apparatus. The apparatus also includes a plurality of switches including a first field-effect semiconductor switch having a gate electrode adjacent a channel region that connects first and second electrodes in response to a threshold switching voltage applied to the gate. The first and second electrodes being connected between the first signal-carrying electrode and a first channel (e.g., as a transistor that couples the first channel with the first signal-carrying electrode when in a conducting state). The switches also include a second field-effect semiconductor switch connected between the second signal-carrying electrode and the first channel, a third field-effect semiconductor switch connected between the first signal-carrying electrode and a second channel, and a fourth field-effect semiconductor switch connected between the second signal-carrying electrode and the second channel. The apparatus further includes an ESD circuit having a diode that connects the first channel and a reference voltage, and which switches to a conducting state in response to a voltage on the first channel exceeding a threshold discharge voltage. A bias circuit mitigates cross-talk between the USB signals and audio data signals concurrently passed on the first and second channels when the first field-effect semiconductor switch is in an off state. Specifically, the bias circuit biases the channel region and boosts the threshold switching voltage to a level that is greater than the threshold discharge voltage, thus mitigating passage of USB signals from one of the signal-carrying electrodes connected to the first channel via the first field-effect semiconductor switch, to the second channel via the first field-effect semiconductor switch.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving the use of a common pin or pins to provide connectivity to disparate channels. While not necessarily so limited, various aspects may be appreciated through a discussion of examples using this context.

Various example embodiments are directed to mitigating cross-talk between two or more channels coupled to a common output or input or input/output pin or pins. In some embodiments, a field-effect semiconductor switch circuit, such as an NMOS or PMOS type switch or transmission gate switch, is controlled using a body effect bias to adjust the switch threshold voltage under conditions susceptible to cross talk.

In accordance with one or more embodiments, cross talk is mitigated on a victim channel (off channel) during a negative voltage undershoot on an aggressor channel (on channel) in a high speed multiplexer. A body effect is controlled in an NMOS or PMOS switch, which decouples the victim and aggressor channels from one another. For instance, where NMOS switches are used to couple a media channel (e.g., an audio channel) to output pins and pass data on another common channel, the data channel can interfere with the audio channel/signaling. A body effect is used to increase a threshold voltage of the NMOS switches to mitigate the interference. In some implementations, the threshold voltage is set higher than a clamping voltage of an electrostatic discharge (ESD) diode coupled to a ground, in response to negative excursions on signaling. In other implementations involving a PMOS switch, the threshold voltage is set higher than a clamping voltage of an ESD diode coupled to a power supply voltage. In this context, a path via the victim channel can be set to high impedance when negative signaling is sensed (e.g., facilitating an isolation of −60 dB or more between channels), for NMOS switch implementations to ensure that the path stays in a disabled/idle state. In another context, a current path via the victim channel can be set to a high impedance when a signal above a supply voltage and below an ESD clamping voltage is present, in response to positive excursions above a supply voltage in a PMOS switch. In transmission gate with a P-type & N-type off/victim switch, a well can be accordingly biased to mitigate the passage of current in an off state. Such an approaches may, for example, help to mitigate the coupling of unwanted distortion from one channel to other channel such as an audio channel, such as by mitigating the coupling of noise from a universal serial bus (USB) source and a digital audio signal, and therein mitigating distortion in audio signals being switched.

In connection with various embodiments, it has been recognized/discovered that isolation improvement with well biasing can be at least −40 dB and about −60 dB. Further, while such MOS type switches are described with various examples herein, these embodiments may be applied to a variety of types of passive switch applications, and can reduce or minimize cross talk or unintentional switch path conduction, such as when switches are connected outside of a device via a cable or docking connector.

Figure 1:
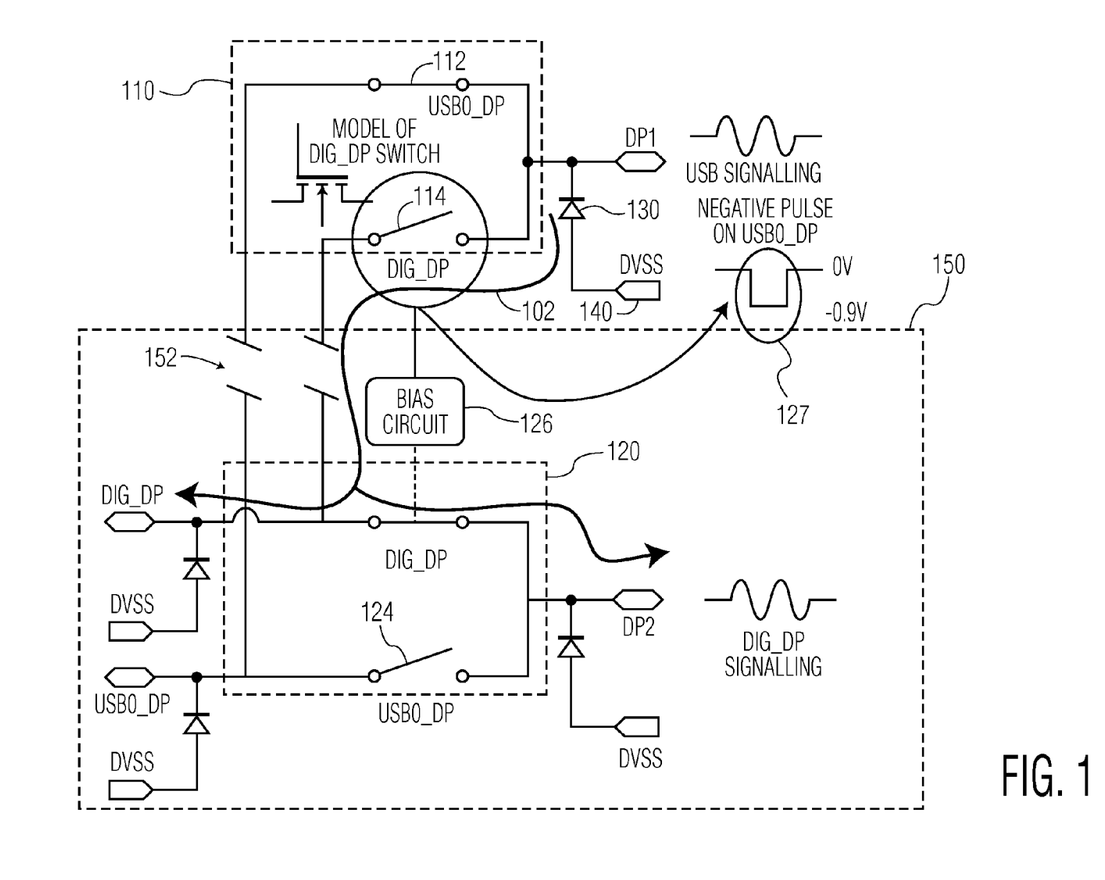
FIG. 1 shows an apparatus that mitigates cross-talk for multi-purpose connections, in accordance with an example embodiment.

Turning now to the figures, FIG. 1 shows an apparatus 100 that mitigates cross-talk for multi-purpose connections, in accordance with another example embodiment. The apparatus 100 includes first and second switching circuits 110 and 120, each of which have respective field-effect semiconductor switches 112, 114, 122 and 124 as shown. An ESD circuit includes a diode 130 and a reference voltage circuit 140, and operates to shunt current from a channel on DP1 when the voltage on DP1 is below a threshold/ESD diode clamping voltage of the diode 130. The apparatus is also shown having other such diodes connected to reference voltage circuits and each of DP2, DIG_DP and UBS0_DP, by way of example.

The apparatus 100 also includes a bias circuit 126 that biases a channel and/or well region of the field-effect semiconductor switch 114 when the switch is in an off state. This biasing boosts the threshold voltage of the switch 114 and mitigates or prevents the flow of current as shown via line 102, when a signal on Pub 1 drops below the reference voltage level at 140 (e.g., where the switch 114 would otherwise conduct at such a voltage level on DP1).

By way of example, such an approach may be implemented with USB signals passed on DP1 concurrently with digital audio signals passed on DP2 and DIG_DP, in which DIG_DP goes into the audio interface and causes distortion or cross talk in digital audio. When the voltage on DP1 drops below the reference voltage, the shown current path 102 can introduce cross-talk from the USB signaling at UBS0_DP (e.g., as an aggressor switch) over to the digital signaling on DP2 and DIG_DP (e.g., a victim digital audio switch). Accordingly, the bias circuit 126 operates to apply a bias to the switch 114 and prevent or mitigate conductance through the switch, when the switch is in the off state. Such a bias may, for example, involve −0.9V a bias as shown at 127 (e.g., where the switch 114 is an NMOS transistor and the bias is applied to a well in which a channel of the transistor lies). This can also mitigate non-symmetrical distortion with negative pulses not being coupled differentially. The bias circuit 126 ensures that the threshold switching voltage of switch 114 is higher than the ESD clamping voltage, such that for higher negative voltages the conduction path is via the ESD diode 130.

As may be implemented in connection with the apparatus shown in FIG. 1 and/or otherwise herein, the following discussion refers to other example embodiments directed to an apparatus having a multi-pin connector including at least first and second signal-carrying electrodes that communicate with a device external to the apparatus, and a plurality of field-effect semiconductor switches, for mitigating cross-talk. The switches include a first switch (e.g., a MOS transistor implemented as 114 in FIG. 1) having a gate electrode adjacent a channel that connects first and second electrodes in response to a threshold switching voltage applied to the gate electrode. The first and second electrodes (e.g., source and drain regions) are connected between the first signal-carrying electrode and a first channel, and when the channel is in a conducting state, couple the first channel with the first signal-carrying electrode (e.g., connects DIG_DP with DP1). The switches also include a second field-effect semiconductor switch (e.g., 112) connected between the second signal-carrying electrode and the first channel, a third field-effect semiconductor switch (e.g., 122) connected between the first signal-carrying electrode and a second channel, and a fourth field-effect semiconductor switch (e.g., 124) connected between the second signal-carrying electrode and the second channel. An electrostatic discharge (ESD) circuit includes a diode (e.g., 130) that connects the first channel and a reference voltage (e.g., 140), and switches to a conducting state in response to a voltage on the first channel is below ESD clamp voltage (e.g., where the ESD circuit clamps the voltage on the first channel in response to a voltage on the first channel being less than the reference voltage).

A bias circuit (e.g., 126) mitigates cross-talk between the first and second channels when the first field-effect semiconductor switch is in an off state by biasing the channel region and boosting the threshold switching voltage to a level that is greater than the ESD clamp voltage. In this regard, the biasing mitigates passage of signals, from one of the signal-carrying electrodes connected to the first channel via the first field-effect semiconductor switch, to the second channel via the first field-effect semiconductor switch. This mitigation may be effected, for example, when a signal such as a universal serial bus (USB) signal is present on the first channel (e.g., passed via the second switch to the first signal-carrying electrode). Such approaches are thus amenable to concurrently communicating USB and digital audio signals. These approaches also facilitate implementation of the first switch having a threshold voltage and operation characteristics that would switch to an ON state in response to a signal on the first channel falling below the reference voltage level, absent the well bias circuit, with the added bias circuit facilitating the OFF state while permitting generally unaltered switching in the ON state.

Figure 5A:
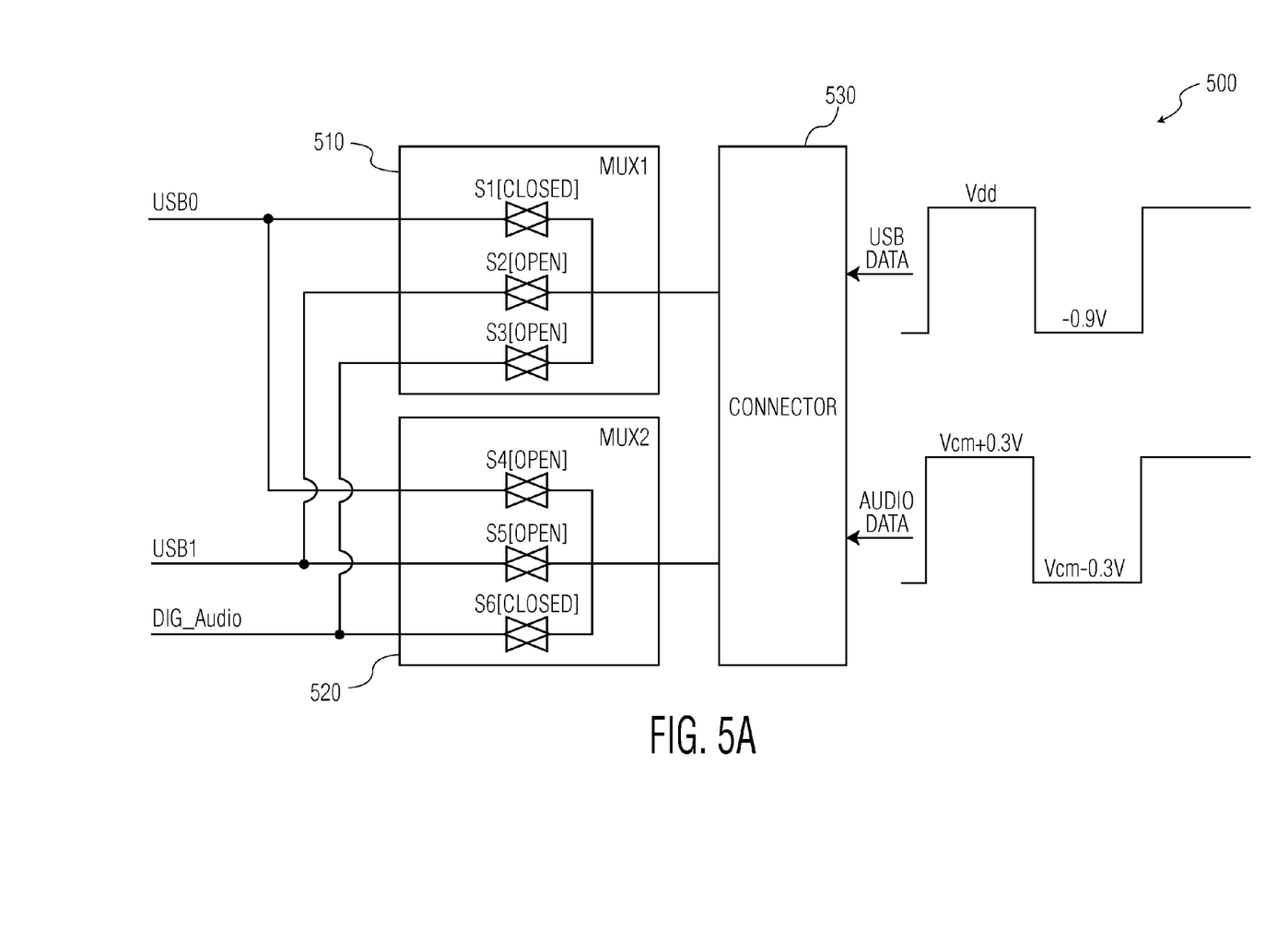
FIGS. 5A and 5B show a switching apparatus that mitigates cross-talk for multi-purpose connections, in respective operating states, in accordance with other example embodiments.
Figure 5B:
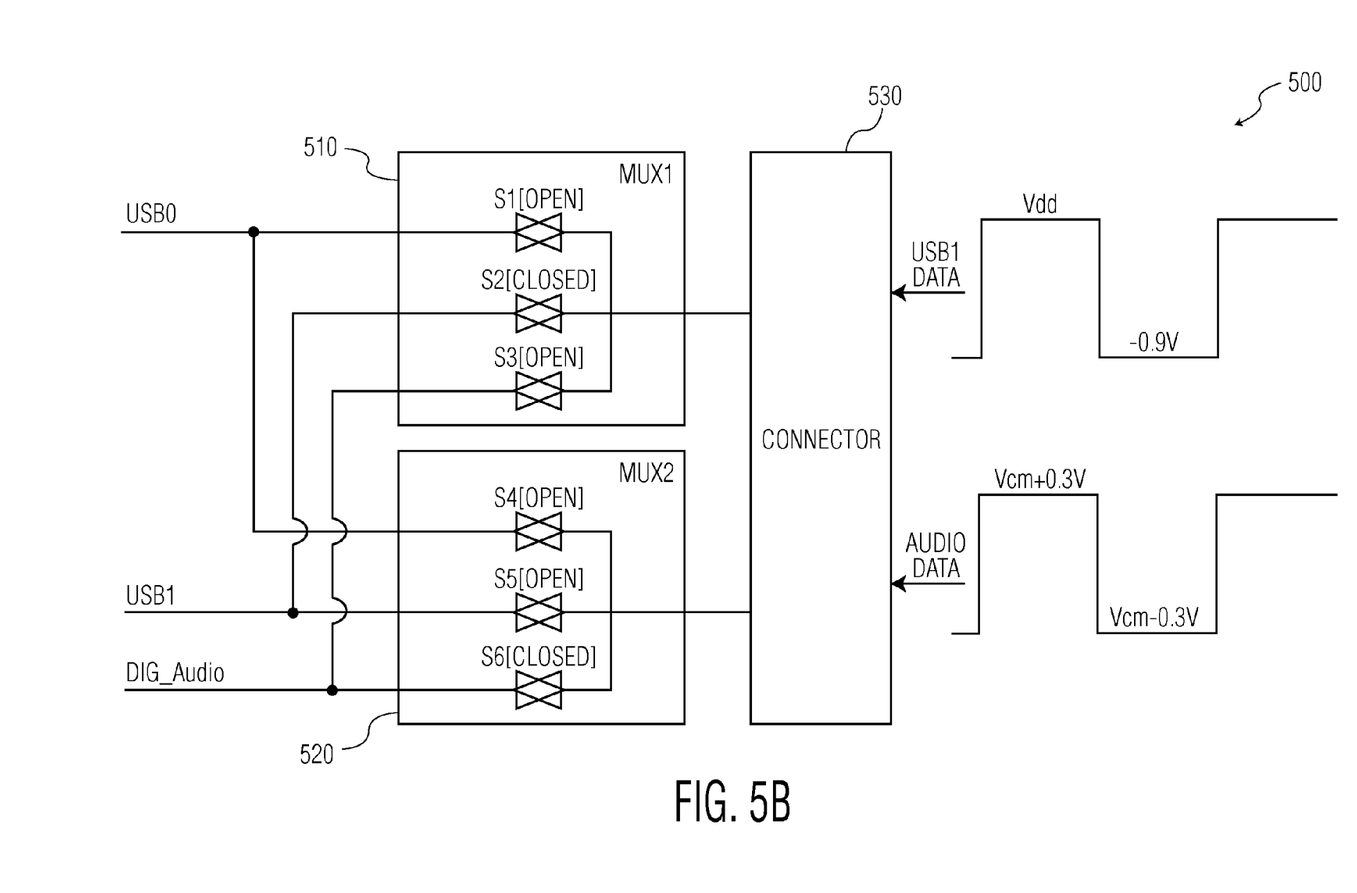

The bias circuit may be implemented in one or more of a variety of manners. For example, the bias circuit may include one or more of a voltage inverter and a back gate that apply a bias to a channel or well region. In various implementations, the bias circuit boosts the threshold switching voltage to a level that prevents the first field-effect semiconductor switch from switching to an on state in response to a voltage level on the second signal-carrying electrode being below the reference voltage. This biasing may, for example, involve applying a well bias that prevents the first switch from passing a signal from the second electrode, received via the second switch, to the third field-effect semiconductor switch (e.g., that prevents the current path 102 in FIG. 1 from becoming active). In other implementations, the bias circuit includes a first switch that connects a biasing voltage to bias the channel region and boost the threshold switching voltage (e.g., as shown in FIGS. 5A and 5B). In certain embodiments, the bias circuit is connected to a well region in which the channel resides (e.g., as a well bias circuit).

The first field-effect semiconductor switch can also be implemented in a variety of manners. In some embodiments, the first switch is an NMOS transistor and the bias circuit boosts the threshold switching voltage by biasing the channel region with a negative voltage. In other embodiments, the first switch is a PMOS transistor and the bias circuit boosts the threshold switching voltage by biasing the channel of the PMOS transistor with a positive voltage.

A variety of signal types are passed as discussed herein. In some embodiments, the multi-pin connector concurrently communicates universal serial bus signals via the first channel and digital audio signals via the second channel, respectively via the first signal-carrying electrode and via the second signal-carrying electrode. The first switch is used in the off state to prevent crosstalk from the universal serial bus signals to the second channel via the third switch, with the bias circuit increasing the threshold of the first switch.

In various embodiments, the third switch also has source and drain regions connected by a channel in a well region, and a gate that switches the channel to a conducting state in response to a threshold switching voltage, based upon a bias state of the channel/well region. A second ESD circuit has a diode that connects the second channel and a reference voltage and switches to a conducting state in response to a voltage on the second channel exceeding a second threshold voltage level. A second channel/well bias circuit mitigates cross-talk between the channels by biasing the channel/well region and boosting the threshold switching voltage of the third field-effect semiconductor switch to a high level in response to the third field-effect semiconductor switch being in an off state. This high level of the third field-effect semiconductor switch is higher than the threshold discharge voltage of the second ESD circuit. The biasing of the third switch thus similarly mitigates passage of a signal, from one of the signal-carrying electrodes that is connected to the second channel to the first channel via the third switch.

Another example embodiment is directed to a two-switch apparatus 150 shown in FIG. 1, including the switches 122 and 124 with the bias circuit 126 implemented to bias switch 122 as described above with switch 112, and without a connection to additional switches 112 and 114 (shown broken at 152). Accordingly, when switch 122 is open and switch 124 is closed to couple USB signals between DP2 and UBS0_DP, switch 122 is biased to mitigate the coupling of the signal on DP2 with DIG_DP.

Figure 2:
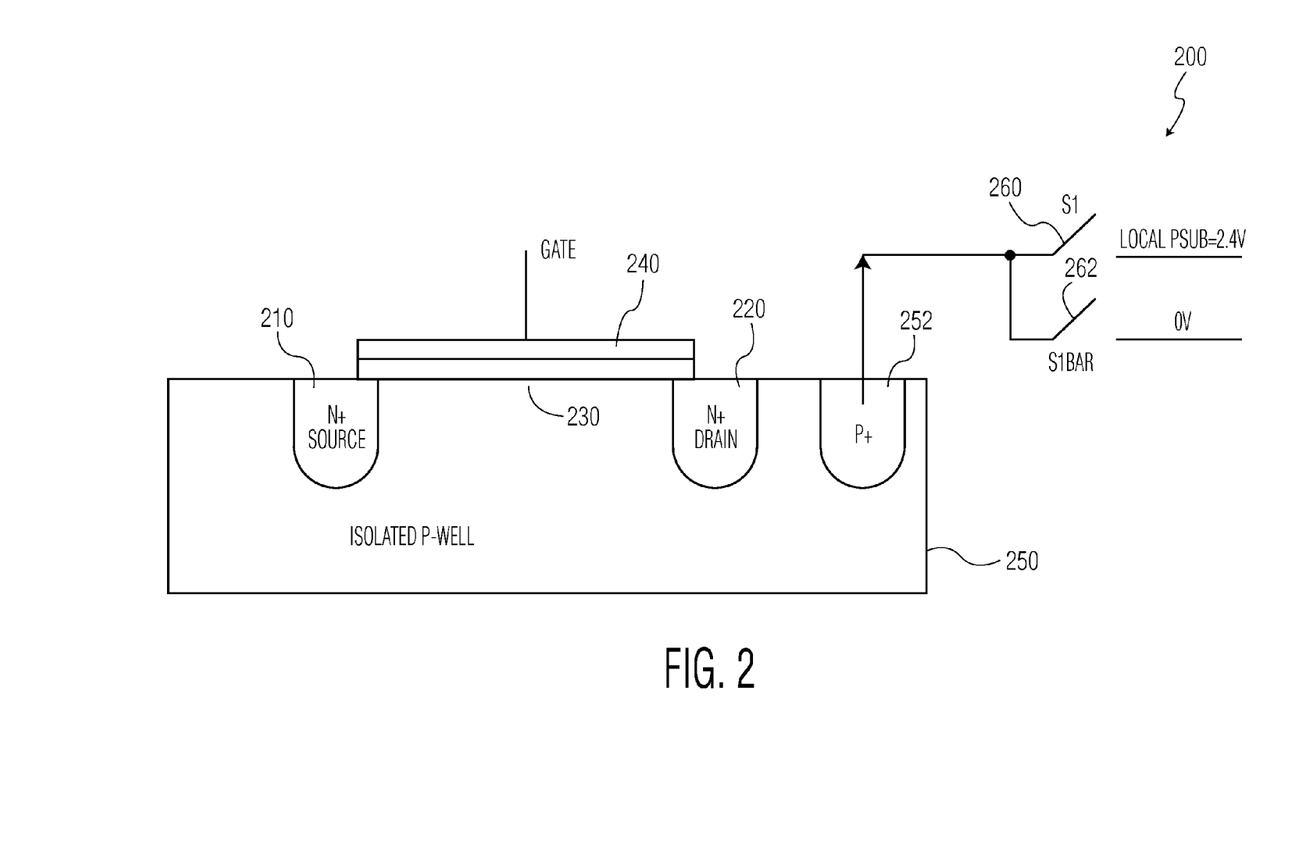
FIG. 2 shows a switching apparatus containing an NMOS switch with a switched well bias that mitigates cross-talk for multi-purpose connections, in accordance with another example embodiment.

FIG. 2 shows a switching apparatus 200 that mitigates cross-talk for multi-purpose connections, in accordance with another example embodiment. The apparatus 200 may, for example, be implemented with a switch such as switch 114 shown in FIG. 1, or other switches therein. The apparatus 200 includes a MOS transistor having a source 210 and drain 220 separated by a channel 230, and a gate 240 over the channel. The channel 230 is located in a p-well 250, which has a highly-doped p+ contact region 252. A bias circuit includes switches 260 and 262 that are operated to apply a bias voltage to the p-well 250, and therein boost the threshold voltage of the transistor (at the application of −2.4V) when the transistor is in an OFF state. By way of example, switch 260 is shown connected to −2.4V, and may be coupled to provide a voltage much less than a voltage applied to the gate 240 when in the OFF state. The body effect is utilized to increase the threshold of the transistor. Switch 260 is closed when the transistor is off, and switch 262 is closed when the transistor is on (e.g., so that the threshold switching voltage is not increased in the conduction state).

Figure 3:
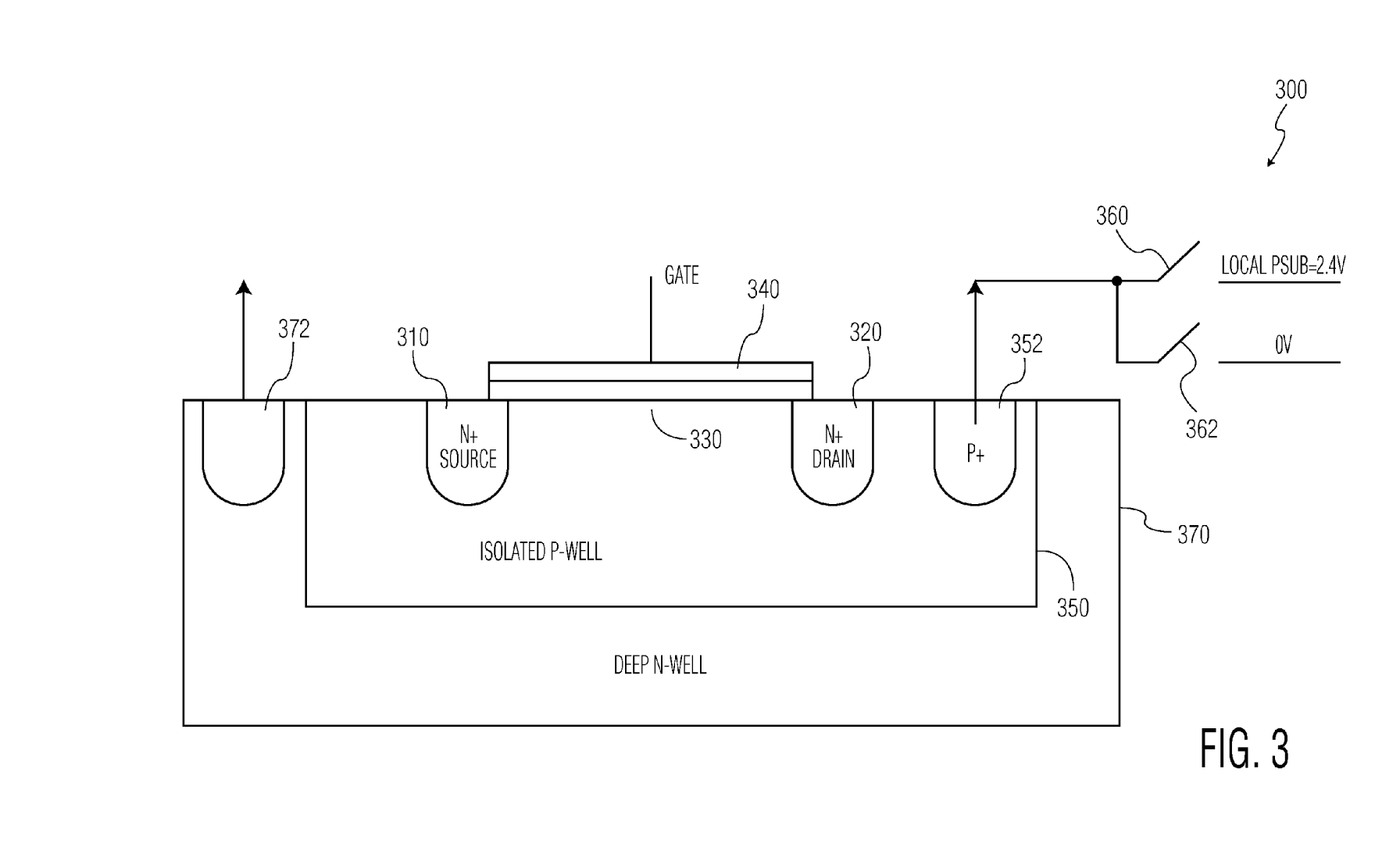
FIG. 3 shows an NMOS switch in an isolated well in a deep n-well region, that mitigates cross-talk for multi-purpose connections, in accordance with another example embodiment.

FIG. 3 shows another switching apparatus 300 that mitigates cross-talk for multi-purpose connections, in accordance with another example embodiment. The apparatus 300 is similar to the apparatus 200, with a transistor having a source 310, drain 320, channel 330, gate 340, a p-well region 350 and p+ contact 352, to which switches 360 and 362 are connected to couple respective voltages (−2.4V and 0V, shown by way of example). The apparatus 300 also includes a deep n-well 370 and an N+ contact to the n-well that is coupled to a voltage (e.g., VDD 3V 0). The deep n-well 370 can be used to create the local p-well 350 in a single well process. Switch 360 is closed when the transistor is off, and switch 362 is closed when the transistor is on.

In various implementations, the biasing of a well or channel region, such as shown in FIG. 3, is implemented in accordance with the following threshold voltage ($V_t$) control, boosted from an initial threshold voltage $V_{to}$ with an applied bias:

$$V_t = V_{tO} + \gamma\sqrt{2\phi_f + v_{SB}} - \gamma\sqrt{2\phi_f}$$

In this regard, an isolated NMOS threshold voltage can be increased when the NMOS transistor is OFF by biasing an isolated p-well to negative voltage (example to −2.4V), in which the threshold voltage is increased by about 35%. Referring to FIG. 1, this approach can set the threshold voltage of the switch 114 higher than the ESD diode 130 such that the diode starts to conduct for higher negative voltages and clamps the voltage below the increased threshold voltage for the NMOS device.

Figure 4:
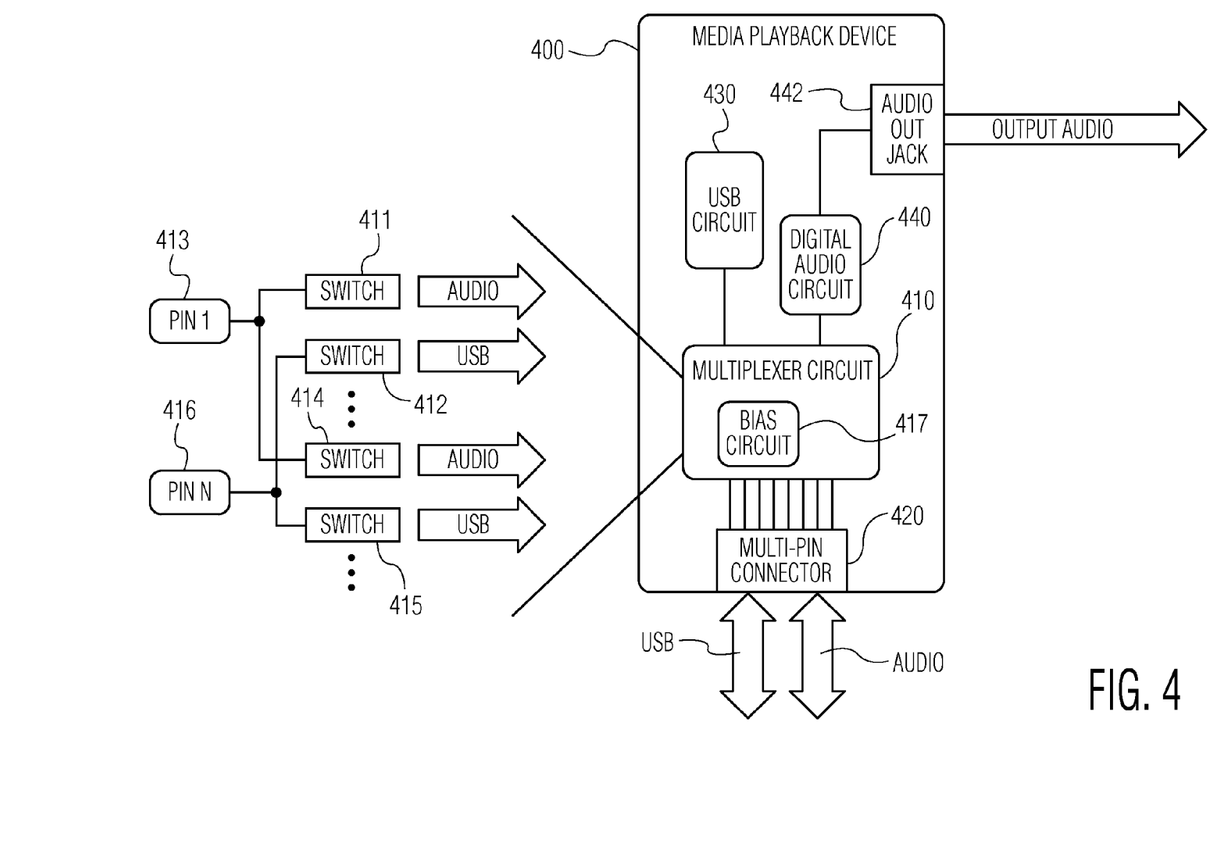
FIG. 4 shows a media playback device with a switching circuit, in accordance with another example embodiment.

FIG. 4 shows a media playback device 400 with a multiplexer circuit 410, in accordance with another example embodiment. The playback device 400 also includes a multi-pin connector 420, which can connect to an external device (e.g., via a cord or docking station), and which passes different types of signals on respective connector pins. The device 400 also includes a USB circuit 430 and a digital audio circuit 440 that provides an audio output via an output jack 442 (e.g., for headphones) or via a wireless connection.

The multiplexer circuit 410 includes switches 411 and 412 that respectively couple an input pin 413 to either the digital audio circuit 440 or the USB circuit 430. Switches 414 and 415 also respectively couple an input pin 416 to either the digital audio circuit 440 or the USB circuit 430. The multiplexer 410 also includes a bias circuit 417 that applies a channel or well bias to one or more of the switches 411, 412, 414 and 415 such as the field-effect switches described herein, to mitigate crosstalk between respective channels. Specifically, the bias circuit 417 biases the a local well or isolated substrate for the non-conducting channel, and boosts the threshold switching voltage of one of the switches to a level that is greater than the ESD threshold clamp voltage, thus mitigating passage of signals between channels. This approach can be used, for example, to facilitate the communication of media signals and USB signals (e.g., data-synching, power, video) in parallel. For instance, such biasing can be used to mitigate interference such as blips that would otherwise be heard on output audio (via 442) if a negative voltage is applied on one of the pins 413 and 416, independent of audio coming from the other ones of the pins. Further, as with other embodiments herein, while two pins are shown, a multitude of such pins and respective additional switches may be implemented to selectively connect more than two pins to a particular channel.

FIGS. 5A and 5B show a switching apparatus that mitigates cross-talk for multi-purpose connections, in respective operating states, in accordance with other example embodiments. Beginning with FIG. 5A, respective multiplexer circuits (e.g., as may be implemented together) 510 and 520 are shown having switches S1-S6, which operate to couple signals between connector 530 and respective channels USB0, USB1 and DIG_Audio as shown with exemplary signal levels. In the instance shown in FIG. 5A, switches S1 and S6 are closed to respectively couple USB data and audio data received at the connector 530 with channels USB0 and DIG_Audio. Each of the switches S2, S3, S4 and S6 are operated in the open position with a bias applied to boost threshold voltage as discussed herein.

Turning to FIG. 5B, switches S2 and S6 are closed, with switches S1, S3, S4 and S5 operated in the open state with a bias as described above, to mitigate cross-talk. Switch S2 passes USB1 data to the USB1 channel, and switch S6 passes audio data to the DIG_Audio channel, again with exemplary signal voltages as shown.

The circuitry, modules, packages and functions discussed herein may be implemented using one or more of a variety of circuits. For instance, discrete logic circuits or programmable logic circuits may be configured and arranged for implementing operations/activities, as shown in the Figures and described above and as may be related to SIM (subscriber identity module) cards, smartcards, and other applications. In certain embodiments, a programmable circuit includes one or more computer type circuits programmed to execute a set (or sets) of instructions (and/or configuration data). The instructions (and/or configuration data) can be in the form of firmware or software stored in and accessible from a memory (circuit). As an example, first and second modules may include a combination of a CPU hardware-based circuit and a set of instructions in the form of firmware, where the first module includes a first CPU hardware circuit with one set of instructions and the second module includes a second CPU hardware circuit with another set of instructions. Such circuits may, for example, communicate data for authentication and/or operation.

Based upon the above discussion and illustrations, those skilled in the art will readily recognize that various modifications and changes may be made to the various embodiments without strictly following the exemplary embodiments and applications illustrated and described herein. For example, various discussion of NMOS applications with regard to well bias and switching can be implemented using PMOS devices, such as to similarly mitigate unintentional switching and related coupling. Various embodiments are directed to and/or may be implemented using one or more approaches to biasing in a switching circuit, such as to mitigate loading of parasitic capacitance or to boost a threshold voltage, as described in U.S. patent application Ser. No. 13/839,687 (now granted U.S. Pat. No. 8,836,408 issued on Sep. 16, 2014) of Den Besten, et al., titled "HIGH-SPEED SWITCH WITH SIGNAL-FOLLOWER CONTROL OFFSETTING EFFECTIVE VISIBLE-IMPEDANCE LOADING," and filed concurrently herewith, which is fully incorporated herein by reference generally and for the teaching as noted above. With regard to threshold voltage discussion, voltages above or below such a threshold and terminology referring to exceeding such a voltage may be implemented to fall below or exceed in a positive or negative direction (e.g., exceeding a value by becoming more negative), based upon the implementation such as NMOS and PMOS. As such, embodiments referring to such thresholds involving exceeding may involve falling below, and falling below may involve exceeding, to effect a similar operation (e.g., cause an ESD circuit to shunt current, or cause a transistor to conduct). For instance, embodiments directed to boosting a transistor threshold voltage higher than an ESD threshold voltage may refer to boosting a transistor threshold voltage to a greater negative value than a negative ESD threshold voltage. In addition, various embodiments may be implemented with portable devices such as tablets or others having Display port connectors in which switches (e.g., Cross Bar Switches) interfacing with a connector. Sensitive digital audio signals such as communicated in an idle mode are not corrupted by the other signal switching such as USB or UART signal switching. In addition, one or more of the switches may be implemented using a different type of switch, such as those that may operate without a field effect. Such modifications do not depart from the true spirit and scope of various aspects of the invention, including aspects set forth in the claims.

What is claimed is:

1. An apparatus comprising:
   a multi-pin connector including at least first and second signal-carrying electrodes configured and arranged to communicate with a device external to the apparatus;
   a first field-effect semiconductor switch having a gate electrode adjacent a channel region configured and arranged to connect first and second electrodes in response to a threshold switching voltage applied to the gate, the first and second electrodes being connected between the first signal-carrying electrode and a first channel;
   a second field-effect semiconductor switch connected between the second signal-carrying electrode and the first channel;
   an electrostatic discharge (ESD) circuit having a diode that connects the first channel and a reference voltage, the ESD circuit being configured and arranged to switch to a conducting state in response to a threshold discharge voltage on the first channel that causes the diode to shunt current; and
   a bias circuit configured and arranged to mitigate cross-talk between the first and second signal-carrying electrodes when the first field-effect semiconductor switch is in an off state by biasing the channel region and boosting the threshold switching voltage to a level that is greater than the ESD threshold discharge voltage, wherein the biasing mitigates passage of signals between the signal-carrying electrodes, via the first field-effect semiconductor switch.

2. The apparatus of claim 1, wherein the bias circuit is configured and arranged to boost the threshold switching voltage to a level that prevents the first field-effect semiconductor switch from switching to an on state when the second field-effect semiconductor switch is in an on state.

3. The apparatus of claim 1, wherein the first field-effect semiconductor switch is an NMOS transistor and the bias circuit is configured and arranged to boost the threshold switching voltage by biasing one of a local substrate or well of the channel region with a negative voltage.

4. The apparatus of claim 1, wherein the first field-effect semiconductor switch is a PMOS transistor and the bias circuit is configured and arranged to boost the threshold switching voltage by biasing one of a local substrate or well of the channel of the PMOS transistor with a positive voltage.

5. The apparatus of claim 1,
   further including a third field-effect semiconductor switch connected between the first signal-carrying electrode and a second channel, and a fourth field-effect semiconductor switch connected between the second signal-carrying electrode and the second channel;
   wherein the multi-pin connector concurrently communicates universal serial bus signals via the first channel and digital audio signals via the second channel, respectively via the first signal-carrying electrode and via the second signal-carrying electrode, while using the first field-effect semiconductor switch in the off state to prevent crosstalk from the universal serial bus signals to the second channel via the third field effect semiconductor switch.

6. The apparatus of claim 1, wherein the bias circuit includes a first switch configured and arranged to connect a biasing voltage to bias the channel region and boost the threshold switching voltage.

7. An apparatus comprising:
   a multi-pin connector including at least first and second signal-carrying electrodes configured and arranged to communicate with a device external to the apparatus;
   a first switching circuit configured and arranged with first and second field-effect semiconductor switches to respectively connect the first and second signal-carrying electrodes to a first channel, the first field-effect semiconductor switch having
      source and drain regions connected by a channel in a well region, and
      a gate configured and arranged to switch the channel to a conducting state in response to a threshold switching voltage that is based upon a bias state of the well region;
   a second switching circuit configured and arranged with third and fourth field-effect semiconductor switches to respectively connect the first and second signal-carrying electrodes to a second channel;
   an electrostatic discharge (ESD) circuit having a diode that connects the first channel and a reference voltage, the ESD circuit being configured and arranged to switch to a conducting state in response to a voltage on the first channel exceeding a threshold discharge voltage; and
   a well bias circuit configured and arranged to mitigate cross-talk between the channels by biasing the well region and boosting the threshold switching voltage to a high level in response to the first field-effect semiconductor switch being in an off state, the high level being higher than the threshold discharge voltage, wherein the biasing mitigates passage of a signal, from one of the signal-carrying electrodes that is connected to the first channel via the first switching circuit, to the second channel via the first switching circuit.

8. The apparatus of claim 7, wherein the well bias circuit is configured and arranged to boost the threshold switching voltage to the high level by boosting the threshold switching voltage to a level that prevents the first field-effect semiconductor switch from switching to an on state in response to a voltage level on the second signal-carrying electrode being below the reference voltage level.

9. The apparatus of claim 7, wherein the ESD circuit is configured and arranged to clamp the voltage on the first channel in response to a voltage on the first channel being less than the reference voltage.

10. The apparatus of claim 7, wherein the first field-effect semiconductor switch is an NMOS transistor and the well bias circuit is configured and arranged to boost the threshold switching voltage by biasing a p-well region of the NMOS transistor with a negative voltage.

11. The apparatus of claim 7, wherein the first field-effect semiconductor switch is a PMOS transistor and the well bias circuit is configured and arranged to boost the threshold switching voltage by biasing an n-well region of the PMOS transistor with a positive voltage.

12. The apparatus of claim 7, wherein the well bias circuit is configured and arranged to mitigate cross-talk between the channels by applying a bias to the well region that prevents the first switch from passing a signal from the second signal-carrying electrode, received via the second field-effect semiconductor switch, to the third field-effect semiconductor switch.

13. The apparatus of claim 7, wherein the multi-pin connector concurrently communicates universal serial bus signals and digital audio signals, respectively via the first signal-carrying electrode and via the second signal-carrying electrode.

14. The apparatus of claim 7, wherein the first field-effect semiconductor switch is configured and arranged to switch to an ON state in response to a signal on the first channel falling below the reference voltage level, absent the well bias circuit.

15. The apparatus of claim 7, wherein the well bias circuit includes a voltage inverter configured and arranged to effect the biasing of the well region.

16. The apparatus of claim 7, wherein the well bias circuit is a back gate configured and arranged to apply a bias to the channel region.

17. The apparatus of claim 7,
wherein the third field-effect semiconductor switch has
source and drain regions connected by a channel in a well region, and
a gate configured and arranged to switch the channel to a conducting state in response to a threshold switching voltage that is based upon a bias state of the well region, and
further including
a second ESD circuit having a diode that connects the second channel and a reference voltage, the second ESD circuit being configured and arranged to switch to a conducting state in response to a voltage on the second channel exceeding a second threshold voltage level, and
a second well bias circuit configured and arranged to mitigate cross-talk between the channels by biasing the well region and boosting the threshold switching voltage of the third field-effect semiconductor switch to a high level in response to the third field-effect semiconductor switch being in an off state, the high level of the third field-effect semiconductor switch being higher than the threshold discharge voltage of the second ESD circuit, wherein the biasing mitigates passage of a signal, from one of the signal-carrying electrodes that is connected to the second channel via the second switching circuit, to the first channel via the second switching circuit.

18. A media playback apparatus comprising:
a user interface configured and arranged to present audio to a user;
an audio playback circuit module configured and arranged to use audio data to generate audio signals, and to present the audio signals to the user interface;
a multi-pin connector including at least first and second signal-carrying electrodes configured and arranged to concurrently communicate both the audio data and universal serial bus (USB) signals with a device external to the apparatus;

a first field-effect semiconductor switch having a gate electrode adjacent a channel region configured and arranged to connect first and second electrodes in response to a threshold switching voltage applied to the gate, the first and second electrodes being connected between the first signal-carrying electrode and a first channel;
a second field-effect semiconductor switch connected between the second signal-carrying electrode and the first channel;
a third field-effect semiconductor switch connected between the first signal-carrying electrode and a second channel;
a fourth field-effect semiconductor switch connected between the second signal-carrying electrode and the second channel;
an electrostatic discharge (ESD) circuit having a diode that connects the first channel and a reference voltage, the ESD circuit being configured and arranged to switch to a conducting state in response to a voltage on the first channel exceeding a threshold discharge voltage; and
a bias circuit configured and arranged to mitigate cross-talk between the USB signals and audio data signals concurrently passed on the first and second channels when the first field-effect semiconductor switch is in an off state by biasing the channel region and boosting the threshold switching voltage to a level that is greater than the threshold discharge voltage, wherein the biasing mitigates passage of USB signals, from one of the signal-carrying electrodes connected to the first channel via the first field-effect semiconductor switch, to the second channel via the first field-effect semiconductor switch.

19. The apparatus of claim 18, wherein the bias circuit is configured and arranged to boost the threshold switching voltage to a level that prevents the first field-effect semiconductor switch from switching to an on state in response to a USB signal voltage level on the second signal-carrying electrode being below the reference voltage.

20. The apparatus of claim 18,
wherein the third field-effect semiconductor switch has a gate electrode adjacent a channel region configured and arranged to connect respective electrodes in response to a threshold switching voltage applied to the gate, the respective electrodes being connected between the second signal-carrying electrode and the second channel,
further including a second ESD circuit having a diode that connects the second channel and a reference voltage, the second ESD circuit being configured and arranged to switch to a conducting state in response to a voltage on the second channel exceeding a second threshold voltage level, and
a second bias circuit configured and arranged to mitigate cross-talk between the first and second channels when the third field-effect semiconductor switch is in an off state by biasing the channel region and boosting the threshold switching voltage of the third field-effect semiconductor switch to a level that is greater than the threshold discharge voltage of the second ESD circuit, wherein the biasing mitigates passage of signals, from one of the signal-carrying electrodes connected to the second channel via the third field-effect semiconductor switch, to the first channel via the third field-effect semiconductor switch.

* * * * *